(12) United States Patent
Li et al.

(10) Patent No.: US 10,624,246 B2
(45) Date of Patent: *Apr. 14, 2020

(54) APPARATUSES FOR IMPLEMENTING COLD-SPARABLE SERDES

(71) Applicant: BAE SYSTEMS INFORMATION AND ELECTRONIC SYSTEMS INTEGRATION INC., Nashua, NH (US)

(72) Inventors: Bin Li, Chantilly, VA (US); Lloyd Brown, Fredericksburg, VA (US); Patrick Fleming, Redondo Beach, CA (US); Jason F. Ross, Haymarket, VA (US)

(73) Assignee: BAE Systems Information and Electronic Systems integration Inc., Nashua, NH (US)

( * ) Notice: Subject to any disclaimer, the term of this patent is extended or adjusted under 35 U.S.C. 154(b) by 331 days.

This patent is subject to a terminal disclaimer.

(21) Appl. No.: 15/668,017

(22) Filed: Aug. 3, 2017

(65) Prior Publication Data

US 2019/0045675 A1    Feb. 7, 2019

(51) Int. Cl.
*H01T 23/00* (2006.01)
*H05K 9/00* (2006.01)
*H04J 3/04* (2006.01)

(52) U.S. Cl.
CPC ........... *H05K 9/0064* (2013.01); *H04J 3/047* (2013.01); *H05K 9/0067* (2013.01)

(58) Field of Classification Search
None
See application file for complete search history.

(56) References Cited

U.S. PATENT DOCUMENTS

| | | | | |
|---|---|---|---|---|
| 5,117,129 | A * | 5/1992 | Hoffman | H01L 27/0203 326/13 |
| 7,673,186 | B2 * | 3/2010 | Hillman | G06F 13/409 714/44 |
| 9,520,869 | B2 * | 12/2016 | Fiedorow | H03K 17/162 |
| 10,135,443 | B1 * | 11/2018 | Ross | H03K 19/00315 |

* cited by examiner

*Primary Examiner* — Stephen W Jackson
(74) *Attorney, Agent, or Firm* — Sand, Sebolt & Wernow LPA; Scott J. Asmus

(57) ABSTRACT

A system for limiting or diminishing current to unpowered Serializer/Deserializer (SerDes) circuitry is provided. The system comprises receiver input termination circuitry and a cold spare circuitry. The receiver input circuitry comprises a termination resistor and an N-type metal oxide silicon field effect transistor (MOSFET). The cold spare circuitry comprises a first MOSFET and a second MOSFET. When the system is powered on, an input current flows to the receiver input termination circuit to be discharged by the N-type MOSFET which is electrically connected to a ground. When the system is powered off, the input current flows to the cold spare circuitry to discharge the input current. Discharging electrons between the first MOSFET and the second MOSFET depends on the polarity of an accumulated voltage.

20 Claims, 4 Drawing Sheets

APPARATUSES FOR IMPLEMENTING COLD-SPARABLE SERDES

BACKGROUND

Technical Field

The present disclosure relates generally to a method and system for limiting current to a circuit. Particularly, the present disclosure relates to use of cold spare circuitry to protect a system. More particularly, the present disclosure relates to a Serializer/Deserializer (SerDes) system including the cold spare circuitry to protect an unpowered SerDes receiver from large current.

Background Information

A Serializer/Deserializer (SerDes) is a pair of functional blocks commonly used in high speed communications to compensate for limited input/output. A transmitting SerDes is called SerDes Tx, and the receiving SerDes is called SerDes Rx. These blocks convert data between serial data and parallel interfaces in each direction. The primary use of the SerDes is to provide data transmission over a single/differential line in order to minimize the number of input/output I/O pins and interconnects.

In space communication applications, there may be some standby sub-systems/boards that have an unpowered SerDes (also called cold spare SerDes). This unpowered SerDes (i.e., SerDes Rx) may be vulnerable when it is connected to a powered SerDes (i.e., SerDes Tx) due to a large and high current input to the SerDes Rx system over the time. As soon as the overall voltage at the input of the unpowered SerDes Rx is higher than the threshold of an Electrostatic Discharge (ESD) circuit installed in the unpowered SerDes Rx, a significant amount of current will flow through the ESD diodes. Over time, this large current will lead to device failure even though the unpowered SerDes Rx is equipped with the EDS diodes.

SUMMARY

Therefore, there is need for a new system to protect an unpowered SerDes system from significant input current.

Some embodiments of the present disclosure provide a cold spare SerDes that can be used in a standby space communication subsystem/board. The cold spare SerDes maintains the overall voltage, which is the signal from a powered SerDes TX plus the built up common mode voltage at the inputs of the unpowered SerDes RX, less than the threshold of the electrostatic discharge (ESD) diode thereby avoiding enormous current passing through the ESD diode. This makes the system coldspare tolerant. As shown in details later, a circuit discharges any built up common mode voltage of the inputs at the unpowered SerDes receiver of a Metal Oxide semiconductor Field Effect Transistor (MOSFET) normally to less than 200 mV for 45 nm technology, or even to 0 V. The added circuit will not have any effect to the existing SerDes during normal operation.

In one example, a system for limiting or diminishing current to unpowered SerDes circuitry is provided. The system may include receiver input termination circuitry and a cold spare circuitry. The receiver input circuitry comprises a termination resistor and a N-type metal oxide semiconductor field effect transistor (MOSFET). The cold spare circuitry comprises a first MOSFET and a second MOSFET. When the system is powered on, an input current flows to the receiver input termination circuit to be discharged by the N-type MOSFET which is electrically connected to a ground. When the system is powered off, the input current flows to the cold spare circuitry to discharge the input current. Discharging electrons between the first MOSFET and the second MOSFET depends on the polarity of an accumulated voltage.

In one example, one embodiment of the present disclosure may provide a system for discharging current in an unpowered Serializer/Deserializer (SerDes) system comprising a receiver input termination circuit, wherein the termination circuit includes a termination resistor and a metal oxide silicon field effect transistor (MOSFET), and a cold spare circuit, wherein the cold spare circuit includes a first MOSFET and a second MOSFET.

In another aspect, one embodiment of the present disclosure may provide a system for discharging current in an unpowered Serializer/Deserializer (SerDes) system comprising a receiver input termination circuit, wherein the termination circuit includes a termination resistor and a metal oxide semiconductor (i.e., silicon) field effect transistor (MOSFET), and a cold spare circuit, wherein the cold spare circuit includes a resistor, a first MOSFET, and a second MOSFET.

In yet another aspect, an embodiment of the present disclosure may provide a system for discharging current in an unpowered Serializer/Deserializer (SerDes) comprising: a receiver input termination circuit, wherein the termination circuit includes a termination resistor and a first metal oxide semiconductor (i.e., silicon) field effect transistor (MOSFET); and a cold spare circuit, electrically coupled to the termination circuit, wherein the cold spare circuit includes a second MOSFET and a third MOSFET. This embodiment or another embodiment may further include wherein the first MOSFET in the receiver input termination circuit is an N-type MOSFET. This embodiment or another embodiment may further include wherein the termination resistor is 50 Ohm. This embodiment or another embodiment may further include wherein the second MOSFET in the cold spare circuit is a P-type MOSFET. This embodiment or another embodiment may further include wherein the termination resistor of the receiver input termination circuit is electrically connected with a drain of the first MOSFET of the receiver input termination circuit. This embodiment or another embodiment may further include wherein a drain of the second MOSFET of the cold spare circuit is electrically in communication with a drain of the third MOSFET of the cold spare circuit. This embodiment or another embodiment may further include wherein a gate of the second MOSFET is electrically connected to a source of the second MOSFET, and a gate of the third MOSFET is electrically connected to the source of the third MOSFET. This embodiment or another embodiment may further include a first electrical line which extends from a first end to a second end, and a second electrical line extending from a third end to a fourth end. This embodiment or another embodiment may further include wherein the first electrical line is electrically in communication with the receiver input termination circuit, and the second electrical line electrically extends between the receiver input termination circuit and the cold spare circuit. This embodiment or another embodiment may further include wherein when the system is powered on, an input current flowing from the first end of the first electrical line is discharged through the termination resistor and the first MOSFET of the receiver input termination circuit; and wherein when the system is powered off, an input current from the first end of the first electrical line is discharged by one of the second MOSFET and the third MOSFET of the cold spare circuit.

In yet another aspect, an embodiment of the present disclosure may provide a system for discharging current in an unpowered Serializer/Deserializer (SerDes) comprising: a receiver input termination circuit, wherein the termination circuit includes a termination resistor and a first metal oxide semiconductor (i.e., silicon) field effect transistor (MOSFET); and a cold spare circuit electrically coupled to the termination circuit, wherein the cold spare circuit includes a resistor, a second MOSFET, and a third MOSFET. This embodiment or another embodiment may further include a first electrical line extending from a first point to a second point, wherein an input current flows from the first point and a receiver circuit is connected to the second point. This embodiment or another embodiment may further include wherein the line is electrically in communication with the resistor in the cold spare circuit, and the resistor is electrically connected with the second MOSFET and the third MOSFET. This embodiment or another embodiment may further include wherein when the system is powered on, the input current flowing from the first point of the electrical line is discharged through the termination resistor and the first MOSFET of the receiver input termination circuit. This embodiment or another embodiment may further include wherein when the system is powered off, the input current flowing from the first point of the electrical line is discharged by one of the second MOSFET and the third MOSFET of the cold spare circuit. This embodiment or another embodiment may further include wherein the termination resistor of the receiver input termination circuit is electrically connected with the first MOSFET of the receiver input termination circuit. This embodiment or another embodiment may further include wherein the second MOSFET is in serial electrical communication with the third MOSFET. This embodiment or another embodiment may further include wherein the first MOSFET in the receiver input termination circuit is an N-type MOSFET. This embodiment or another embodiment may further include wherein the MOSFET in the cold spare circuit is a P-type MOSFET.

BRIEF DESCRIPTION OF THE SEVERAL VIEWS OF THE DRAWINGS

A sample embodiment of the present disclosure is set forth in the following description, is shown in the drawings and is particularly and distinctly pointed out and set forth in the appended claims.

Similar numbers refer to similar parts through the drawings.

DETAILED DESCRIPTION

The present disclosure relates to a system for protecting an unpowered Serializer/Deserializer (SerDes) system from significant current flowing into the system when the unpowered SerDes system (La, SerDes Rx) is connected with a powered SerDes system (La, SerDes Tx).

Figure 1:
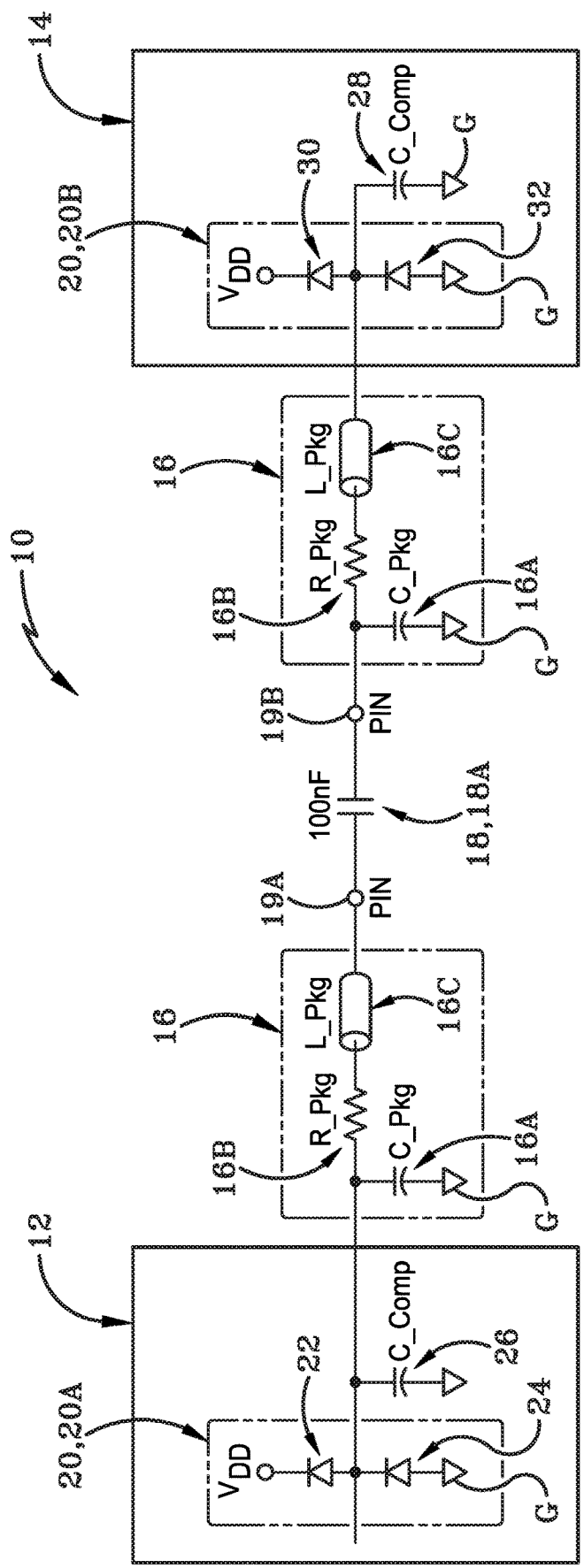
FIG. 1 is a schematic view of a conventional stereo Serializer/Deserializer (SerDes) system which is implemented on various applications such as remote space satellite systems.

FIG. 1 depicts a conventional stereo SerDes system 10 comprising a SerDes transmitter (SerDes Tx) 12, a SerDes receiver (SerDes Rx) 14, a set of package parameters 16, and a channel capacitor 18. As shown, both SerDes Tx 12 and SerDes Rx 14 include electrostatic discharge (ESD) diodes 20 respectively.

A first electrostatic discharge (ESD) diode 20A which is in the SerDes Tx 12 comprises a first diode 22 and a second diode 24 which may be operatively connected in series relative to each other. One end of the ESD diode 20A is connected to a voltage source "$V_{DD}$", the other end of the ESD diode 20A is connected with a ground "G". The ESD diode 20A is used to prevent an instant flow of high current with a high voltage from damaging a circuit in the system. The ESD diode 20A is made to discharge this high voltage current to the ground "G" or voltage source "$V_{DD}$". The ESD diode 20A may be connected with a parasitic capacitor 26 which is connected to the ground "G".

Each package parameter 16 may include a parasitic capacitor 16A, a parasitic resistor 16B, and a parasitic inductor 16C. The channel capacitor 18 may include a capacitor 18A which extends between a first pin 19A and a second pin 19B. Generally, the capacitor 18A has a value of about 100 nF.

A second electrostatic discharge (ESD) diode 20B which is in the SerDes Rx 14 comprises a first diode 30 and a second diode 32 which may be operatively connected in series with respective to each other. One end of the ESD diode 20B is connected with a voltage source "$V_{DD}$", the other end of the ESD diode 20B is connected with a ground "G". The ESD diode 20B may be connected with a parasitic capacitor 28 which is connected to the ground "G".

The SerDes Rx 14 in the stereo SerDes system 10 can be vulnerable to electrical overstress when it is connected to a powered and active SerDes Tx 12. When unpowered, the receiver input termination circuit resistance, (typically 50 Ohms to ground), is in a high impedance state. As a result of the AC coupling capacitor and the high impedance input termination, the common mode voltage at the receiver input can float to any value between approximately −0.7V to approximately 0.7V which corresponds to the forward bias threshold voltage of the ESD diode structure. When the common mode voltage at the receiver input moves too far from 0V, a large current will be sunk by one of the ESD diodes. Over time, this large current can lead to device failure.

Figure 2:
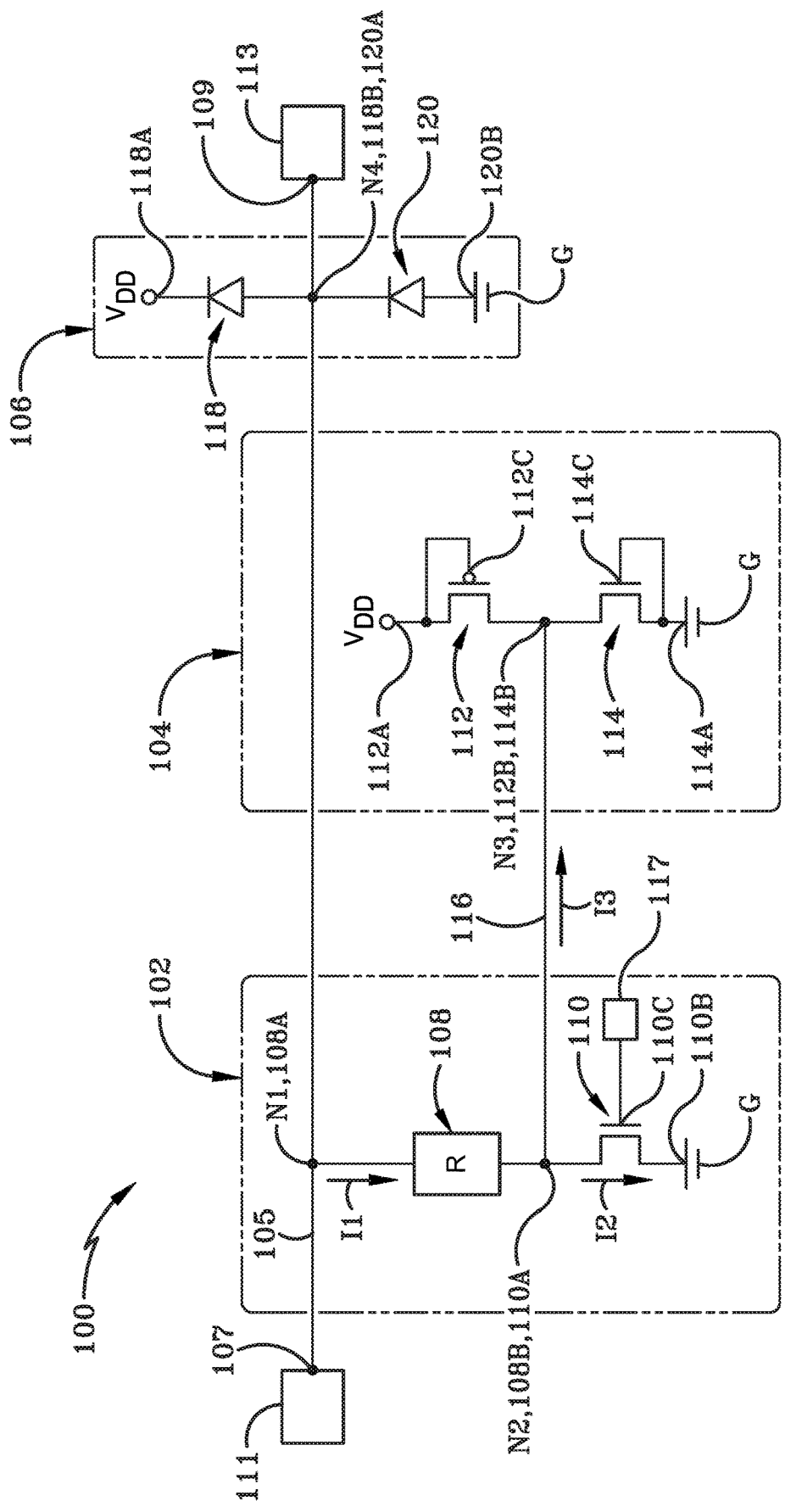
FIG. 2 illustrates a first embodiment of a SerDes system in accordance with the present disclosure.

One exemplary embodiment of a SerDes receiver (SerDes Rx) system 100 is shown in FIG. 2. The SerDes system 100 comprises a receiver input termination circuit 102, a cold spare circuit 104, and an electrostatic discharge diode 106. A main electrical line 105 is defined by a first end 107 and a second end 109. The first end 107 is connected to an input signal 111, and the second end 109 is connected to a SerDes receiver circuit 113.

The receiver input termination circuit 102 comprises a termination resistor 108 and a Metal Oxide Semiconductor (i.e., silicon) Field Effect Transistor (MOSFET) 110. In this particular embodiment, the MOSFET 110 is an N-type MOSFET. However, in another embodiment, a P-type MOSFET can be used to replace the N-type MOSFET 110. The cold spare circuit 104 comprises a first MOSFET (M1) 112 and a second MOSFET (M2) 114.

A first end 108A of the termination resistor 108 of the receiver input termination circuit 102 is connected to the line

105 at a first node N1. A second end 108B of the termination resistor 108 is connected to a drain 110A of the MOSFET 110 at a second node N2. A source 110B of the MOSFET 110 is connected to a ground "G". A gate 110C of the MOSFET 110 is connected to a voltage source 117.

The first MOSFET (M1) 112 in the cold spare circuit 104 comprises a source 112A, a drain 112B, and a gate 112C. The second MOSFET (M2) 114 in the cold spare circuit 104 comprises a source 114A, a drain 114B, and a gate 114C. The first MOSFET (M1) 112 and the second MOSFET (M2) 114 are connected at the third node N3. The source 112A is connected to a voltage source "$V_{DD}$" while source 114A is connected to the ground "G". Each gate 112C, 114C are connected to each source 112A, 114A respectively. In this particular embodiment, the first MOSFET (M1) 112 is a P-type MOSFET. However, in another embodiment, the first MOSFET (M1) 112 can be an N-type MOSFET.

The receiver input termination circuit 102 is connected to the cold spare circuit 104 by an electrical line 116 which extends between the receiver input termination circuit 102 and the cold spare circuitry 104. More specifically, the line 116 extends from the second node N2 located between the termination resistor 108 and the MOSFET 110 to the third node N3 located between the first MOSFET (M1) 112 and the second MOSFET (M2) 114 in the cold spare circuitry 104.

The ESD diode 106 comprises a first diode 118 and a second diode 120 which are serially connected at a fourth node N4. A first end 118A of the first diode 118 is connected to a voltage source "$V_{DD}$", and a second end 118B of the first diode 118 is connected to a first end 120A of the second diode 120 at the fourth node N4. A second end 120B of the diode 120 is directly connected to the ground "G".

Figure 3:
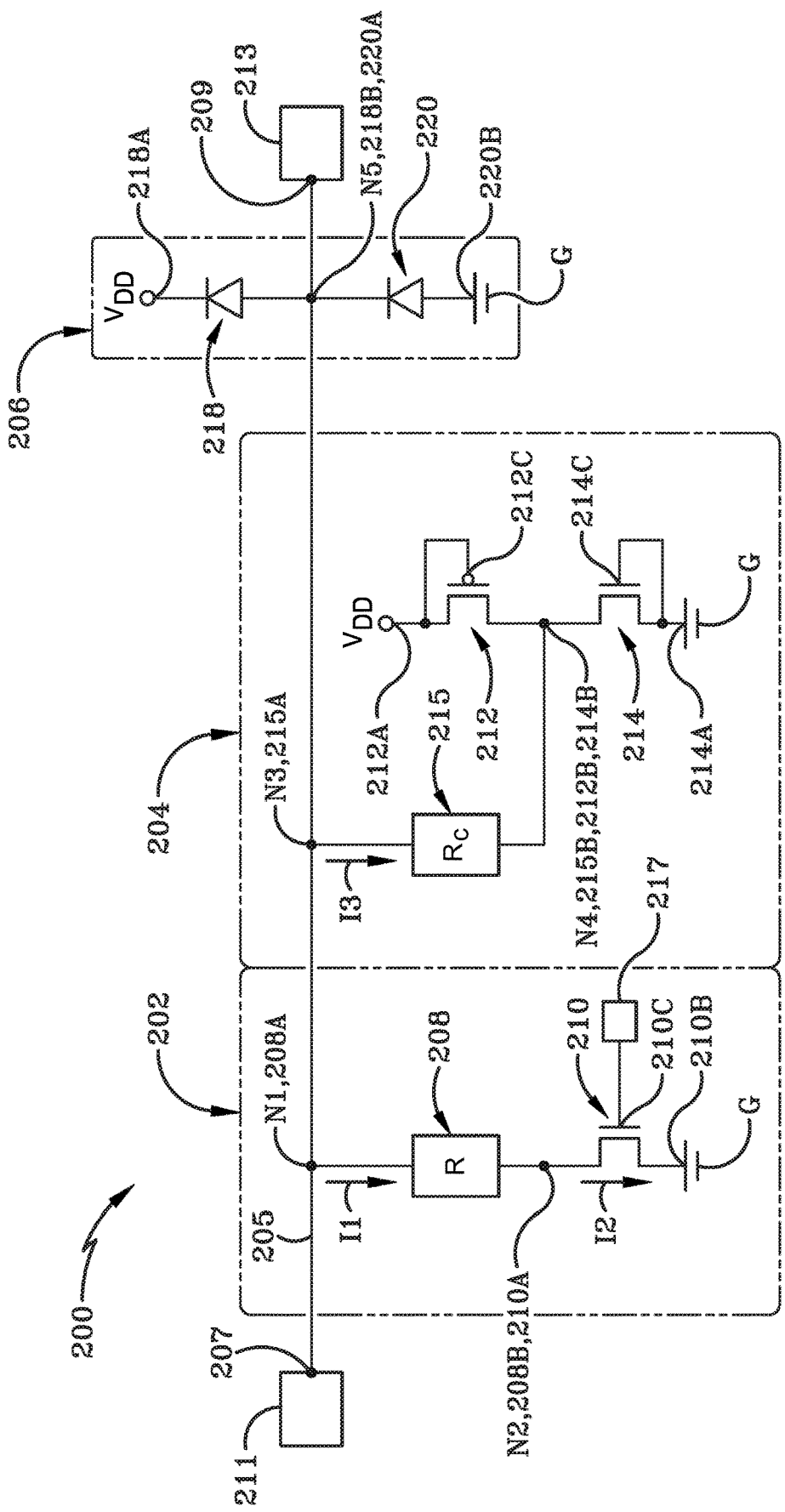
FIG. 3 illustrates a second embodiment of a SerDes system in accordance with the present disclosure.

An exemplary second embodiment of a SerDes system 200 is shown in FIG. 3. The second embodiment system 200 has a similar structure as the first embodiment system 100 except for a different configuration of a cold spare circuit. Particularly, the second embodiment system 200 comprises a receiver input termination circuit 202 and a cold spare circuit 204, and an electrostatic discharge (ESD) diode 206. A main electrical line 205 is defined by a first end 207 and a second end 209 extending from the first end 207 to the second end 209. The first end 207 is connected to an input signal 211, and the second end 209 is connected to a SerDes receiver circuit 213.

Similar to the first embodiment 100, the receiver input termination circuit 202 of the second embodiment 200 comprises a termination resistor 208 and a Metal Oxide Silicon Field Effect Transistor (MOSFET) 210. In this particular embodiment, the MOSFET 210 is an N-type MOSFET. However, in another embodiment, a P-type MOSFET can be used to replace the N-type MOSFET 210. However, unlike the first embodiment 100, the cold spare circuit 204 of the second embodiment 200 comprises a resistor ($R_C$) 215, a first MOSFET 212, and a second MOSFET 214. The ESD diode 206 comprises a first diode 218 and a second diode 220. Furthermore, as depicted in FIG. 3, since the first node N1 and the third node N3 are the same, the receiver input termination circuit 202 shares a common node with the cold spare circuitry 204.

A first end 208A of the termination resistor 208 of the receiver input termination circuit 202 is connected to the electrical line 205 at a first node N1. A second end 208B of the termination resistor 208 is directly connected to a drain 210A of the MOSFET 210 at a second node N2. A source 210B is connected to a ground "G". A gate 210C of the MOSFET 210 is connected to a voltage source 217.

As depicted in FIG. 3, a first end 215A of the resistor ($R_C$) 215 in the cold spare circuitry 204 is connected to the main electrical line 205 at a third node N3. A second end 215B of the resistor ($R_C$) 215 is connected to the first and second MOSFETs 214, 216 at a fourth node N4. The first MOSFET 214 comprises a first source 214A, a first drain 214B, and a first gate 214C. The second MOSFET 216 comprises a second source 216A, a second drain 216B, and a second gate 216C.

The ESD diode 206 is substantially similar to the ESD diode 106 of the first embodiment 100, wherein the ESD diode 206 comprises a first diode 218 and a second diode 220 which are serially connected at a fifth node N5. A first end 218A of the first diode 218 is connected to a voltage source "$V_{DD}$", and a second end 218B of the first diode 218 is connected to a first end 220A of the second diode 220. A second end 220B of the diode 220 is connected to the ground "G".

Figure 4:
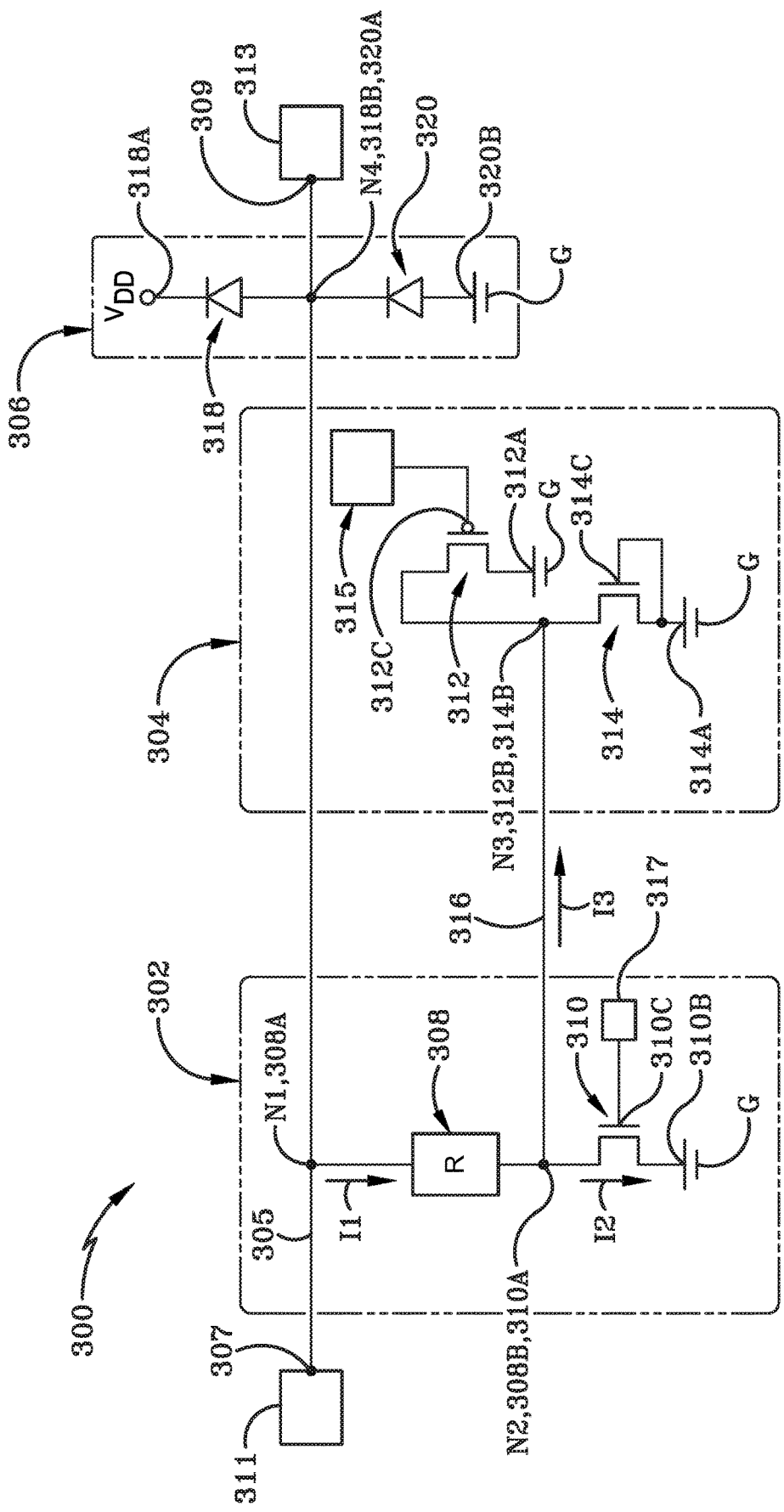
FIG. 4 illustrates a third embodiment of a SerDes system in accordance with the present disclosure.

An exemplary third embodiment of a SerDes Rx system 300 is shown in FIG. 4. The SerDes Rx system 300 comprises a receiver input termination circuit 302, a cold spare circuitry 304, an electrostatic discharge diode 306. A main electrical line 305 is defined by a first end 307 and a second end 309 extending from the first end 307 to the second end 309. The first end 307 is connected to an input signal 311, and the second end 309 is connected to a SerDes receiver circuit 313.

The receiver input termination circuit 302 comprises a termination resistor 308 and a Metal Oxide Silicon Field Effect Transistor (MOSFET) 310. In this particular embodiment, the MOSFET 310 is an N-type MOSFET. However, in another embodiment, a P-type MOSFET can be used to replace the N-type MOSFET 310. A first end 308A of the termination resistor 308 is connected with the electrical line 305 at a first node N1. A second end 308B of the termination resistor 308 is connected to the MOSFET 310 at a second node N2. In particular, a drain 310A of the MOSFET 310 is connected to the second node N2, a source 310B of the MOSFET 310 is connected to a ground "G", and a gate 301C is connected to a voltage source 317.

The cold spare circuit 304 comprises a first MOSFET (M1) 312 and a second MOSFET (M2) 314. The first MOSFET (M1) comprises a first source 312A, a first drain 312B, and a first gate 312C. The second MOSFET (M2) 314 comprises a second source 314A, a second drain 314B, and a second gate 314C. More particularly, the first drain 312B of the first MOSFET 312 and the second drain 314B of the second MOSFET 314 is connected at a third node N3. The first source 312A and the second source 314A are connected to the ground "G" respectively. The first gate 312C is connected to a voltage source 315, and the second gate 314C is connected to the source 314A of the second MOSFET 314.

The receiver input termination circuit 302 is connected to the cold spare circuit 304 by an electrical line 316 which extends between the receiver input termination circuit 302 and the cold spare circuit 304. More specifically, the line 316 extends from the second node N2 located between the termination resistor 308 and the MOSFET 310 to the third node N3 located between the first MOSFET (M1) 312 and the second MOSFET (M2) 314 of the cold spare circuitry 304.

The electrostatic discharge (ESD) diode 306 is substantially similar to the ESD diode 106 of the first embodiment 100, wherein the ESD diodes 306 in the third embodiment comprise a first diode 318 and a second diode 320 which are serially connected at a fourth node N4. A first end 318A of the first diode 318 is connected to a voltage source "$V_{DD}$", and a second end 318B of the first diode 318 is connected to a first end 320A of the second diode 320. A second end 320B of the diode 320 is directly connected to the ground "G".

In operation, as shown in FIG. 2, for the first embodiment system 100, the second node N2 and the third node N3 are the same node, and the first node N1 and the fourth node N4 are the same node. When a receiver is powered on (in functional mode), the first MOSFET (M1) 112 and the second MOSFET (M2) 114 in the cold spare circuit 104 are turned off, while the N-type MOSFET 110 in the receiver input termination circuit 102 is turned on, all current will flow in the direction of arrow I1 through the termination resistor 108 in the receiver input termination circuit 102. The current will flow out to the ground "G" through the source 110B of the N-type MOSFET 110 in the direction of arrow I2. Since the voltage at the first node N1 is higher than the ground "G" but lower than $V_{DD}$ of the ESD diodes 106, and the ESD diodes 106 are reverse-biased, therefore, there is no current flowing towards the ESD diodes 106. Because both the first MOSFET (M1) 112 and the second MOSFET (M2) 114 are turned off, there is no current flowing through these two MOSFETs 112, 114. Therefore, all current passes to the ground "G" through the N-type MOSFET 110. For the N-type MOSFET 110, once "gate to source" voltage is higher than "threshold" voltage of the MOSFET 110, a channel underneath the gate 110C is turned on to permit electron flow from the drain 110A of the MOSFET 110 to the source 110B (the ground "G") of the MOSFET 110 when the voltage at the drain 110A is higher than that at the source 110B.

When the receiver is powered off (and the embodiment system 100 is in cold spare mode), all current will flow to the cold spare circuit 104 in the direction of arrow I3 because the N-type MOSFET 110 in the receiver input termination circuit 102 is turned off. Accumulated current at the first node N1 is discharged through the termination resistor 108 (with a value of 50 Ohm) and either the first MOSFET (M1) 112 or the second MOSFET (M2) 114 depending the polarity of the accumulated current at the first node N1.

With respect to the first embodiment system 100, when the receiver is powered on (in functional mode), input current $I_{input}$ at the first node N1 flows to the termination resistor 108 indicated by arrow "I1". At the second node N2, all current will flow to the ground "G" through the drain 110A and the source 110B by a channel created by voltage input at the gate 110C which is indicated by an arrow "I2". When the receiver is powered off (in cold spare mode), the input current $I_{input}$ at the second node N2 will flow to the cold spare circuitry 104 indicated by an arrow "I3". At the third node N3, the current will be discharged through either the first MOSFET (M1) 112 or by the second MOSFET (M2) 114 depending on the polarity of the current.

As shown in FIG. 3, for the second embodiment system 200, the first node N1, the third node N3, and the fifth node N5 are the same node. When the SerDes receiver is powered on (in functional mode), the first MOSFET (M1) 212 and the second MOSFET (M2) 214 in the cold spare circuit 204 are turned off, while the N-type MOSFET 210 in the receiver input termination circuit 202 is turned on, all current flows through the termination resistor 208 in the receiver input termination circuit 202 and N-type MOSFET 210 to the ground "G". The voltage at the first node N1 is higher than the ground "G" but lower than $V_{DD}$ of the ESD diodes 206, and the ESD diodes 206 are reverse-biased, therefore, there is no current flowing towards the ESD diodes 206. Because both the first MOSFET (M1) 212 and the second MOSFET (M2) 214 are turned off, there is no current flowing through these two MOSFETs 212, 214. Therefore, all current will pass through the N-type MOSFET 210 to the ground "G".

When the SerDes receiver of embodiment system 200 is powered off (in cold spare mode), all current will flow to the cold spare circuitry 204 because the N-type MOSFET 210 in the receiver input termination circuit 202 is turned off and the resistor ($R_c$) 215 is added, wherein the resistor ($R_c$) 215 is located between the third node N3 and the fourth node N4. Once the receiver is in cold spare mode, the voltage at the first node N1 will be discharged by either the first MOSFET (M1) 212 or the second MOSFET (M2) 214 through the resistor ($R_c$) 215.

With respect to the second embodiment system 200, when the SerDes receiver is powered on (in functional mode), input current ($I_{input}$) at the first node N1 will flow to the termination resistor 208 indicated by arrow "I1". Furthermore, all current will flow to the ground "G" through the drain 210A and the source 210B through a channel created by voltage at the gate 210C, wherein the current flow is indicated by an arrow "I2". When the receiver is powered off (in cold spare mode), all input current ($I_{input}$) at the third node N3 will flow to the cold spare circuitry 204 indicated by an arrow "I3" due to the resistor ($R_C$) 218. At the third node N3, the current will be discharged through either the first MOSFET (M1) 214 or the second MOSFET (M2) 216 depending the polarity of the current.

As shown in FIG. 4, for the third embodiment system 300, the first node N1 and the fourth node N4 are the same node. When the SerDes receiver is powered on (in functional mode), the first MOSFET (M1) 312 and the second MOSFET (M2) 314 in the cold spare circuitry 304 are turned off, and the N-type MOSFET 310 is turned on and the first node N1 (input of the receiver) is terminated by the termination resistor 308. Thus, all current will flow to "I1" at the first node N1 and flow to "I2" at the second node N2.

When the receiver is powered off (in cold-spare mode), all current will flow to "I3" of the cold spare circuit 304 at the second node N2 because the N-type MOSFET 310 in the receiver input termination circuit 302 is turned off. As the current flows into the third node N3, either the first MOSFET (M1) 312 or the second MOSFET (M2) 314 is turned on to discharge the current at the first node N1 through the termination resistor 308. Discharging electrons between the first MOSFET (M1) 312 and the second MOSFET (M2) 314 depends on the polarity of the accumulated voltage at the node N1.

With respect to the third embodiment system 300, when the receiver is powered on (in functional mode), input current $I_{input}$ at the first node N1 flows to the termination resistor 108 indicated by arrow "I1". At the second node N2, all current will flow to the ground "G" through the drain 310A and the source 310B by a channel created by voltage input at the gate 310C which is indicated by an arrow "I2". When the receiver is powered off (in cold spare mode), the input current $I_{input}$ at the second node N2 will flow to the cold spare circuitry 304 indicated by an arrow "I3". At the third node N3, the current will be discharged through either by the first MOSFET (M1) 312 or by the second MOSFET (M2) 314 depending the polarity of the current.

The indefinite articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or"

should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment or example, to A only (optionally including elements other than B); in another embodiment or example, to B only (optionally including elements other than A); in yet another embodiment or example, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment or example, to at least one, optionally including more than one, A, with no B present (and optionally including elements other than B); in another embodiment or example, to at least one, optionally including more than one, B, with no A present (and optionally including elements other than A); in yet another embodiment or example, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

An embodiment is an implementation or example of the present disclosure. Reference in the specification to "an embodiment," "one embodiment," "some embodiments," "one particular embodiment," "an exemplary embodiment," or "other embodiments," or the like such as "an example," means that a particular feature, structure, or characteristic described in connection with the embodiments is included in at least some embodiments or examples, but not necessarily all embodiments or examples, of the present disclosure. The various appearances "an example," "an embodiment," "one embodiment," "some embodiments," "one particular embodiment," or "other embodiments," or the like, are not necessarily all referring to the same embodiments or examples.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of the preferred embodiment of the disclosure are an example and the disclosure is not limited to the exact details shown or described.

What is claimed:

1. A system for discharging current in an unpowered Serializer/Deserializer (SerDes) comprising:
   a receiver input termination circuit, wherein the termination circuit includes a termination resistor and a first metal oxide silicon field effect transistor (MOSFET); and
   a cold spare circuit, electrically coupled to the termination circuit, wherein the cold spare circuit includes a second MOSFET and a third MOSFET.

2. The system defined in claim 1, wherein the first MOSFET in the receiver input termination circuit is an N-type MOSFET.

3. The system defined in claim 1, wherein the termination resistor is 50 Ohm.

4. The system defined in claim 1, wherein the second MOSFET in the cold spare circuit is a P-type MOSFET.

5. The system defined in claim 1, wherein the termination resistor of the receiver input termination circuit is electrically connected with a drain of the first MOSFET of the receiver input termination circuit.

6. The system defined in claim 1, wherein a drain of the second MOSFET of the cold spare circuit is electrically in communication with a drain of the third MOSFET of the cold spare circuit.

7. The system defined in claim 1, wherein a gate of the second MOSFET is electrically connected to a source of the second MOSFET, and a gate of the third MOSFET is electrically connected to the source of the third MOSFET.

8. The system defined in claim 1, wherein a gate of the second MOSFET is electrically connected to a voltage source.

9. The system defined in claim 1, further comprising a first electrical line which extends from a first end to a second end, and a second electrical line extending from a third end to a fourth end.

10. The system defined in claim 9, wherein the first electrical line is electrically in communication with the receiver input termination circuit, and the second electrical line electrically extends between the receiver input termination circuit and the cold spare circuit.

11. The system defined in claim 9, wherein when the system is powered on, an input current flowing from the first end of the first electrical line is discharged through the termination resistor and the first MOSFET of the receiver input termination circuit; and wherein when the system is powered off, an input current from the first end of the first electrical line is discharged by one of the second MOSFET and the third MOSFET of the cold spare circuit.

12. A system for discharging current in an unpowered Serializer/Deserializer (SerDes) comprising:
 a receiver input termination circuit, wherein the termination circuit includes a termination resistor and a first metal oxide silicon field effect transistor (MOSFET); and
 a cold spare circuit electrically coupled to the termination circuit, wherein the cold spare circuit includes a resistor, a second MOSFET, and a third MOSFET.

13. The system defined in claim 12, further comprising a first electrical line extending from a first point to a second point, wherein an input current flows from the first point and a receiver circuit is connected to the second point.

14. The system defined in claim 13, wherein the electrical line is electrically in communication with the resistor in the cold spare circuit, and the resistor is electrically connected with the second MOSFET and the third MOSFET.

15. The system defined in claim 13, wherein when the system is powered on, the input current flowing from the first point of the electrical line is discharged through the termination resistor and the first MOSFET of the receiver input termination circuit.

16. The system defined in claim 13, wherein when the system is powered off, the input current flowing from the first point of the electrical line is discharged by one of the second MOSFET and the third MOSFET of the cold spare circuit.

17. The system defined in claim 12, wherein the termination resistor of the receiver input termination circuit is electrically connected with the first MOSFET of the receiver input termination circuit.

18. The system defined in claim 12, wherein the second MOSFET is in serial electrical communication with the third MOSFET.

19. The system defined in claim 12, wherein the first MOSFET in the receiver input termination circuit is an N-type MOSFET.

20. The system defined in claim 12, wherein the MOSFET in the cold spare circuit is a P-type MOSFET.

* * * * *